United States Patent
Udagawa

(10) Patent No.: US 7,759,149 B2
(45) Date of Patent: Jul. 20, 2010

(54) GALLIUM NITRIDE-BASED SEMICONDUCTOR STACKED STRUCTURE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 517 days.

(21) Appl. No.: 11/628,957

(22) PCT Filed: Jun. 9, 2005

(86) PCT No.: PCT/JP2005/010991

§ 371 (c)(1),
(2), (4) Date: Mar. 2, 2007

(87) PCT Pub. No.: WO2005/022289

PCT Pub. Date: Dec. 22, 2005

(65) Prior Publication Data

US 2008/0283823 A1     Nov. 20, 2008

Related U.S. Application Data

(60) Provisional application No. 60/580,910, filed on Jun. 21, 2004.

(30) Foreign Application Priority Data

Jun. 9, 2004     (JP) .............................. 2004-171108

(51) Int. Cl.
  *H01L 21/00*     (2006.01)
  *H01L 21/36*     (2006.01)

(52) U.S. Cl. .................. 438/46; 438/483; 267/E21.113

(58) Field of Classification Search ................. 257/189, 257/190, E21.097, E21.098, E25.032, E33.033, 257/E33.034; 438/46, 478, 479, 483
See application file for complete search history.

(56) References Cited

U.S. PATENT DOCUMENTS

| 5,777,350 | A | 7/1998 | Nakamura et al. | |
|---|---|---|---|---|
| 6,365,921 | B1 | 4/2002 | Watanabe et al. | |
| 6,724,013 | B2* | 4/2004 | Kneissl et al. | 257/79 |
| 2002/0094002 | A1 | 7/2002 | Amano et al. | |
| 2003/0160254 | A1* | 8/2003 | Henrichs | 257/88 |
| 2004/0165635 | A1 | 8/2004 | Sugimoto et al. | |
| 2005/0082544 | A1* | 4/2005 | Narukawa et al. | 257/79 |

FOREIGN PATENT DOCUMENTS

JP     2-288388     11/1990

(Continued)

OTHER PUBLICATIONS

Steckl et al., Rare-Earth-Doped GAn: Growth, Properties, and Fabrication of Electroluminescent Device, 2002, IEEE Journal of Selected Topics in Quantum Electronics, vol. 8, No. 4, pp. 749-766.*
Isamu Akasaki; "Group III-V Compound Semiconductor—Advanced Electronics Series I-1, Category I: Electronic Material, Physical Characteristic, Device"; Baifukan Publishing Co., Ltd.; pp. 329-351 (1994).

*Primary Examiner*—Thomas L Dickey
*Assistant Examiner*—Nikolay Yushin
(74) *Attorney, Agent, or Firm*—Sughrue Mion, PLLC

(57) ABSTRACT

A gallium-nitride-based semiconductor stacked structure includes a sapphire substrate; a low-temperature-deposited buffer layer which is composed of a Group III nitride material of $Al_XGa_YN$ ($0.5<Y\leq1$, $X+Y=1$) containing gallium (Ga) in a predominant amount with respect to aluminum (Al), which has been grown at low temperature and which is provided in a junction area thereof joined to a (0001) plane (c-plane) of the sapphire substrate with a single crystal in an as-grown state; and a gallium-nitride (GaN)-based semiconductor layer formed on the low-temperature-deposited buffer layer. The low-temperature-deposited buffer layer is predominantly composed of an as-grown single crystal which has a [1.0.-1.0.] orientation parallel to a [2.-1.-1.0.] direction of a lattice forming a (0001) basal plane of the sapphire substrate.

4 Claims, 4 Drawing Sheets

FOREIGN PATENT DOCUMENTS

| | | |
|---|---|---|
| JP | 7-288231 | 10/1995 |
| JP | 8-255926 | 10/1996 |
| JP | 10-41232 A | 2/1998 |
| JP | 10-97994 A | 4/1998 |
| JP | 10-107319 A | 4/1998 |
| JP | 10-321905 | 12/1998 |
| JP | 2000-133884 A | 5/2000 |
| JP | 2000-340839 A | 12/2000 |
| JP | 2001-44497 A | 2/2001 |
| JP | 2001-77414 A | 3/2001 |
| JP | 2001-119069 A | 4/2001 |
| JP | 2002-134786 A | 5/2002 |
| JP | 2004-111997 A | 4/2004 |

* cited by examiner

GALLIUM NITRIDE-BASED SEMICONDUCTOR STACKED STRUCTURE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/580,910 filed Jun. 21, 2004 and Japanese Patent Application No. 2004-171108 filed Jun. 9, 2004 pursuant to 35 U.S.C. §111(b).

TECHNICAL FIELD

The present invention relates to structural requirements for a buffer layer formed at low temperature and advantageous for fabricating a stacked structure from a gallium-nitride-based Group III-V compound semiconductor layer having improved orientation characteristics, and to a compound semiconductor device including the stacked structure.

BACKGROUND ART

Conventionally, gallium nitride (GaN)-based Group III-V compound semiconductors of a zinc-blende crystal type or a Wurtzite crystal type are employed for fabricating semiconductor devices, such as a light-emitting device emitting visible light of short wavelength (see, for example, JP-A HEI 2-288388). Stacked structures for fabricating gallium-nitride-based semiconductor devices are produced by use of a single-crystal substrate composed of a high-heat-resistance aluminum oxide, such as sapphire ($\alpha$-$Al_2O_3$ single crystal) or a garnet single-crystal (see, for example, JP-A HEI 7-288231).

The above single-crystal substrate composed of aluminum oxide (e.g., sapphire) has lattice constants considerably different from those of a gallium nitride (GaN)-based semiconductor material. Thus, the stacked structure for use in fabrication of gallium-nitride-based semiconductor devices is generally formed via a buffer layer on a single-crystal substrate. The buffer layer for mitigating mismatch in terms of lattice constants is generally called a "low-temperature-deposited buffer layer" since the layer has been conventionally formed at relatively low temperature (see, for example, Book edited by Isamu AKASAKI, "Group III-V Compound Semiconductors," published by Baifukan Co., Ltd., 1st edition, Chapter 13, (May 20, 1995)).

The low-temperature-deposited buffer layer is formed from, for example, gallium nitride (see, for example, JP-A HEI 8-255926). In order to mitigate lattice constant mismatch with respect to a crystalline substrate, the low-temperature-deposited buffer layer is preferably formed of an amorphous material or a polycrystalline material in an as-grown state (see, for example, JP-A HEI 8-255926). Meanwhile, there has been disclosed another technique for forming a low-temperature-deposited buffer layer of a layer having a junction area with respect to a crystalline substrate formed in an as-grown state into a single-crystal layer (see, for example, JP-A HEI 10-321905).

However, the low-temperature-deposited buffer layer formed on the surface of a sapphire substrate has a drawback in that the orientation of the single-crystal layer included in the buffer layer is not sufficiently unified on the surface of the sapphire substrate, thereby failing to attain consistent formation, on the substrate, of a GaN-based Group III nitride semiconductor layer having a well-unified orientation and excellent single-crystal characteristics.

Thus, an object of the present invention is to provide a crystal structural feature of a single-crystal layer included in a low-temperature-deposited buffer layer so as to form, on a low-temperature-deposited buffer layer of $Al_XGa_YN$ (0<X, Y<1, X+Y=1) having a single-crystal layer included in the vicinity of a junction interface area thereof in contact with a substrate, a gallium-nitride-based semiconductor layer having excellent single-crystal characteristics that is suitably grown. Another object of the invention is to provide a stacked structure having a GaN-based nitride semiconductor layer of excellent single-crystal characteristics that is formed via a low-temperature-deposited buffer layer including a single-crystal layer having the above crystal feature. Yet another object of the invention is to provide a compound semiconductor device exhibiting excellent characteristics by virtue of employment of the stacked structure.

DISCLOSURE OF THE INVENTION

In order to attain the aforementioned objects, a first aspect of the present invention is directed toward a gallium-nitride-based semiconductor stacked structure comprising a sapphire substrate; a low-temperature-deposited buffer layer which is composed of a Group III nitride material of $Al_XGa_YN$ (0.5<Y≦1, X+Y=1) containing gallium (Ga) in a predominant amount with respect to aluminum (Al), which has been grown at low temperature and which is provided in a junction area thereof joined to a (0001) plane (c-plane) of the sapphire substrate with a single crystal in an as-grown state; and a gallium-nitride (GaN)-based semiconductor layer formed on the low-temperature-deposited buffer layer, wherein the low-temperature-deposited buffer layer is predominantly composed of an as-grown single crystal which has a [1.0.−1.0.] orientation parallel to a [2.−1.−1.0.] direction of a lattice forming a (0001) basal plane of the sapphire substrate.

A second aspect of the invention is directed to the gallium-nitride-based semiconductor stacked structure according to the first aspect, which further includes an active layer stacked on the low-temperature-deposited buffer layer and a thin-film layer interposed between the low-temperature-deposited buffer layer and the active layer and composed of a GaN-based Group III nitride semiconductor containing indium (In) or aluminum (Al).

A third aspect of the invention is directed to the gallium-nitride-based semiconductor stacked structure according to the second aspect, wherein the thin-film layer has a layer thickness of 2 nm to 100 nm.

A fourth aspect of the invention is directed to the gallium-nitride-based semiconductor stacked structure according to the second or third aspect, which further includes, between the low-temperature-deposited buffer layer and the active layer, a superlattice structure layer having a thin-film layer composed of a GaN-based Group III nitride semiconductor containing indium (In) or aluminum (Al).

A fifth aspect of the invention is directed to the gallium-nitride-based semiconductor stacked structure according to any one of the second to fourth aspects, which further includes an aluminum gallium indium nitride layer provided on the low-temperature-deposited buffer layer, wherein the thin-film layer composed of a GaN-based Group III nitride semiconductor containing indium (In) or aluminum (Al) or the superlattice structure layer having the thin-film layer is provided between the active layer and the aluminum gallium indium nitride layer, and wherein the aluminum gallium indium nitride layer is represented by $Al_\alpha Ga_\beta In_{1-\alpha-\beta}N$ (0≦α, β≦1, 0≦α+β≦1).

A sixth aspect of the invention is directed to the gallium-nitride-based semiconductor stacked structure according to any one of the second to fifth aspects, wherein the thin-film layer composed of a GaN-based Group III nitride semiconductor containing indium (In) or aluminum (Al) has an orientation that coincides with that of the single-crystal layer included in the low-temperature-deposited buffer layer.

A seventh aspect of the invention is directed to a method for forming a gallium-nitride-based semiconductor stacked structure comprising the steps of providing a sapphire substrate, forming, on the sapphire substrate, a low-temperature-deposited buffer layer which is composed of a Group III nitride material of $Al_XGa_YN$ (0.5<Y≦1, X+Y=1) containing gallium (Ga) in a predominant amount with respect to aluminum (Al) and which is provided in a junction area thereof joined to a (0001) plane (c-plane) of the sapphire substrate with a single crystal in an as-grown state, and forming a gallium-nitride-based semiconductor layer on the low-temperature-deposited buffer layer, wherein the low-temperature-deposited buffer layer is formed on the (0001) plane of the sapphire substrate in such a manner that the junction area is predominantly formed from an as-grown single crystal which has a [1.0.−1.0.] orientation parallel to a [2.−1.−1.0.] direction of a lattice forming the (0001) basal plane of the sapphire substrate.

An eighth aspect of the invention is directed to the method for forming a gallium-nitride-based semiconductor stacked structure according to the seventh aspect, wherein the low-temperature-deposited buffer layer is formed on the (0001) plane of the sapphire substrate at 350° C. to 450° C.

A ninth aspect of the invention is directed to the method for forming a gallium-nitride-based semiconductor stacked structure according to the seventh or eighth aspect, wherein the low-temperature-deposited buffer layer is formed on the (0001) plane of the sapphire substrate at a growth rate of 1 nm/min to 3 nm/min.

A tenth aspect of the invention is directed to the method for forming a gallium-nitride-based semiconductor stacked structure according to the ninth aspect, wherein the low-temperature-deposited buffer layer is formed on the (0001) plane of the sapphire substrate at a growth rate of 1 nm/min to 3 nm/min controlled through regulation of an amount, per unit time, of a Group III element source including gallium or aluminum supplied to a growth reaction system for growing the low-temperature-deposited buffer layer.

An eleventh aspect of the invention is directed to the method for forming a gallium-nitride-based semiconductor stacked structure according to any one of the seventh to tenth aspects, wherein the as-grown single crystal which is contained in the low-temperature-deposited buffer layer and which predominantly forms the junction area joined to the sapphire substrate has a thickness of 1 nm or more when formation of the low-temperature-deposited buffer layer has been completed.

A twelfth aspect of the invention is directed to a gallium-nitride-based semiconductor device comprising the gallium-nitride-based semiconductor stacked structure according to any one of the first to sixth aspects, or a gallium-nitride-based semiconductor stacked structure produced through the method according to any one of the seventh to eleventh aspects.

According to the present invention, the single-crystal layer which is provided in an as-grown state in the junction area of the low-temperature-deposited buffer layer joined to the surface of the sapphire substrate attains a well-unified orientation of a GaN-based Group III nitride semiconductor layer deposited on the low-temperature-deposited buffer layer.

The present invention provides a gallium-nitride-based semiconductor stacked structure comprising a sapphire substrate; a low-temperature-deposited buffer layer which is composed of a Group III nitride material, which has been grown at low temperature and which is provided in a junction area thereof joined to a (0001) plane of the sapphire substrate with a single crystal in an as-grown state; and a gallium-nitride-based semiconductor layer formed on the low-temperature-deposited buffer layer. The stacked structure is fabricated from a GaN-based semiconductor layer via the low-temperature-deposited buffer layer containing an as-grown single crystal which is composed of a well-unified, hexagonal $Al_XGa_YN$ (0.5<Y≦1, X+Y=1) crystal and which has the [1.0.−1.0.] orientation parallel to the [2.−1.−1.0.] direction of the sapphire substrate. Therefore, the stacked structure can be advantageously fabricated from a GaN-based semiconductor layer having a well-unified orientation and excellent single-crystal characteristics.

According to the present invention, the low-temperature-deposited buffer layer composed of a single-crystal containing gallium in an amount more than that of aluminum is formed at a specific growth temperature and growth rate. Therefore, a single-crystal layer that is well-unified with a specific crystal orientation of the sapphire substrate can be formed. In addition, the single-crystal layer advantageously enhances the orientation of a GaN-based semiconductor single-crystal layer formed on the buffer layer. Through employment of the stacked structure having a well-unified orientation and excellent single-crystal characteristics, semiconductor devices, such as a light-emitting diode, exhibiting excellent emission characteristics, i.e. causing few local breakdowns in the reverse direction, can be effectively produced.

The above and other objects, characteristic features and advantages of the present invention will become apparent to those skilled in the art from the description given herein below with reference to the accompanying drawings.

BEST MODE FOR CARRYING OUT THE INVENTION

Figure 1:
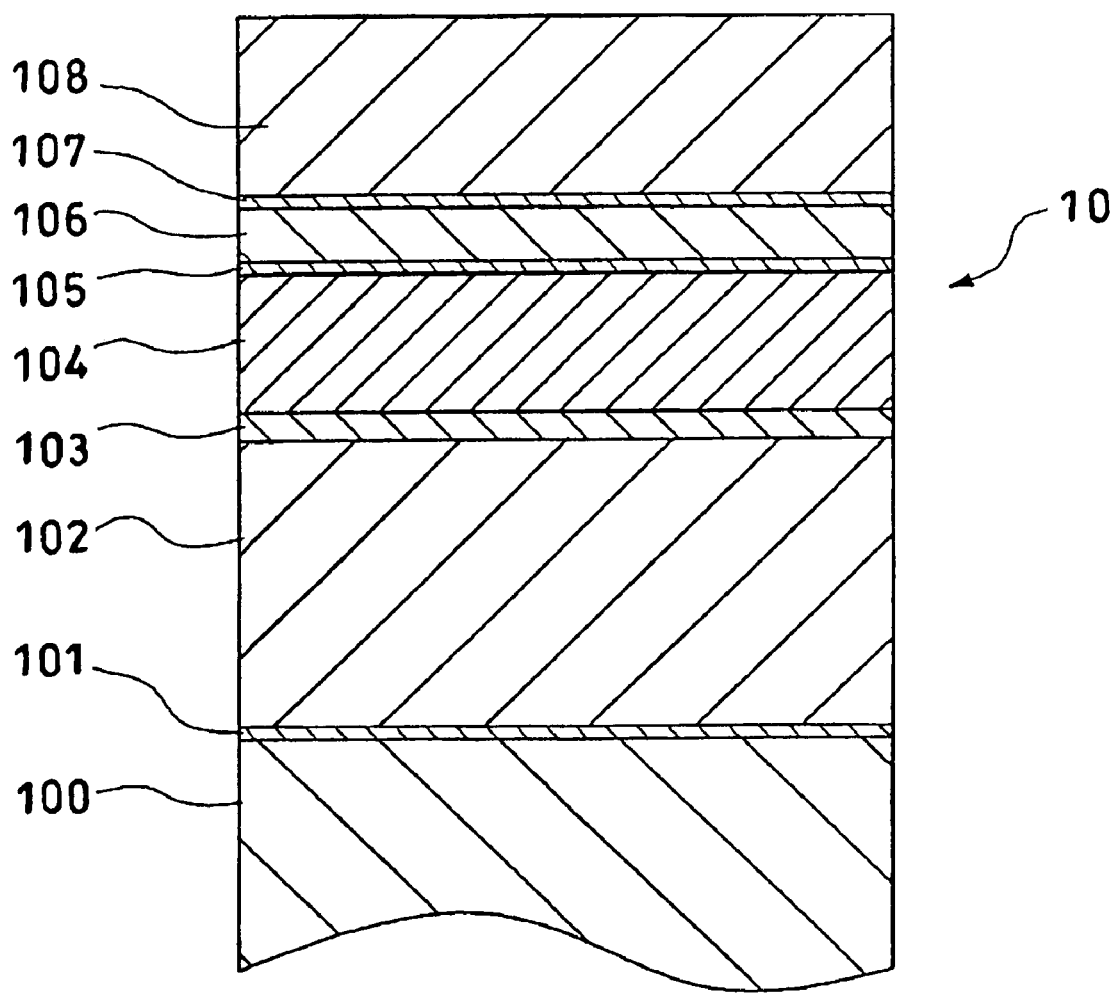
FIG. 1 is a schematic cross-section of the semiconductor stacked structure of Example 1 of the present invention.

The $Al_XGa_YN$ low-temperature-deposited buffer layer is formed on a sapphire substrate through, for example, a metal-organic chemical vapor deposition (abbreviated as MOCVD) means. For example, an $Al_XGa_YN$ layer is formed through a MOCVD means by use of a metal-organic (abbreviated as MO) compound, such as trimethylgallium (($CH_3)_3Ga$)₍triethylgallium (($C_2H_5)_3Ga$) or trimethylaluminum (($CH_3)_3Al$) as a source. Ammonia ($NH_3$) or a similar compound may be used as a nitrogen source. Hydrazines which are decomposed at lower temperature may also be employed as nitrogen (N) sources for growing the low-temperature-deposited buffer layer.

When an $Al_XGa_YN$ low-temperature-deposited buffer layer including a junction portion composed of an as-grown hexagonal single crystal is to be formed on a sapphire substrate, particularly on a (0001) plane (i.e., c-plane), the growth temperature is essentially controlled so as to fall within an appropriate range. Specifically, the growth temperature is preferably controlled to 250° C. to 500° C.

When the growth temperature is lower than 250° C., formation of the $Al_XGa_YN$ low-temperature-deposited buffer layer is unsatisfactorily attained due to insufficient thermal decomposition of growth sources, whereas when the growth temperature is higher than 500° C., a large number of crystals grow at random, thereby failing to reliably form a low-temperature-deposited buffer layer containing a continuous single crystal that sufficiently and homogeneously covers the substrate surface (e.g., a low-temperature-deposited buffer layer composed of a continuous single crystal in the layer form (single-crystal layer)). Needless to say, both cases are problematic.

The term "as-grown single crystal" refers to a single crystal which is formed in an as-grown state of the low-temperature-deposited buffer layer. Even when the single crystal is subjected to a subsequent film formation step or a device fabrication step, the single crystal contained in the buffer layer is maintained.

More preferably, the $Al_XGa_YN$ low-temperature-deposited buffer layer is grown at 350° C. to 450° C. When the growth temperature falls within the temperature range, the formed low-temperature-deposited buffer layer comes to include, at the junction interface between the buffer layer and the sapphire substrate, an $Al_XGa_YN$ crystal having a crystal orientation unified in a specific direction.

Particularly when the low-temperature-deposited buffer layer is formed from an $Al_XGa_YN$ ($0.5<Y \leq 1$, $X+Y=1$) crystal containing gallium in an amount greater than that of aluminum, the formed low-temperature-deposited buffer layer contains a single crystal composed of $Al_XGa_YN$ ($0.5<Y \leq 1$, $X+Y=1$) such that the [1.0.−1.0.] orietation of the $Al_XGa_YN$ crystal is parallel to the [2.−1.−1.0.] (a-axis) direction of the c-plane (basal unit lattice) of the sapphire substrate. Whether or not the formed low-temperature-deposited buffer layer assumes a single crystal may be determined on the basis of appearance of diffraction spots in an electron diffraction image. When a halo or a ring diffraction image appears, the formed layer can be determined to be amorphous or polycrystalline.

When the growth rate is regulated to 1 through 3 nm/min, a single crystal or a single-crystal layer formed of single crystals connected whose orientation is well-unified with respect to a specific crystal axis of the sapphire substrate can be formed more effectively and reliably. The growth rate may be controlled by modifying the amount per unit time (supply rate) of a Group III element (e.g., gallium or aluminum) source supplied to the reaction system for growing the low-temperature-deposited buffer layer. Thus, when the amount of aluminum or gallium supplied to the growth reaction system or the total amount thereof is increased, the growth rate can be increased. In the case where the concentration of gallium exceeds that of aluminum during supply of aluminum and gallium to the growth reaction system, a low-temperature-deposited buffer layer composed of an $Al_XGa_YN$ ($0.5<Y \leq 1$, $X+Y=1$) crystal containing Ga in an amount greater than that of Al can be formed.

The orientation feature of the single-crystal layer included in the low-temperature-deposited buffer layer and present in a junction area thereof joined to the sapphire substrate may be determined through, for example, electron diffraction method.

In one determination procedure of the orientation feature, an incident electron beam is made incident on the $Al_XGa_YN$ low-temperature-deposited buffer layer in parallel to the [2.−1.−1.0.] direction of a sapphire substrate to capture an electron diffraction pattern of the buffer layer. When a reciprocal-lattice image attributable to the $Al_XGa_YN$ low-temperature-deposited buffer layer as viewed from an orientation of [1.0.−1.0.] appears in the electron diffraction pattern, the $Al_XGa_YN$ single-crystal layer included in the low-temperature-deposited buffer layer is determined such that the [1.0.−1.0.] orientation of the $Al_XGa_YN$ single-crystal layer forming the low-temperature-deposited buffer layer is parallel to the [2.−1.−1.0.] direction of the sapphire substrate.

The low-temperature-deposited buffer layer of the present invention may be formed of a single-crystal layer in its entirety.

In other words, an amorphous $Al_XGa_YN$ may be present on the single-crystal layer included in the low-temperature-deposited buffer layer, as observed in a cross-sectional TEM (transmission electron microscope) image of the low-temperature-deposited buffer layer in an as-grown state. This is because such an amorphous substance is known to be crystallized when a GaN-based semiconductor layer is grown on the low-temperature-deposited buffer layer at a temperature higher than the temperature at which the low-temperature-deposited buffer layer has been grown.

In the above case, since the single crystal or single-crystal layer having the aforementioned well-unified orientation is present to serve as an under layer, the unified orientation feature of the under layer is reflected to the amorphous substance, which is advantageous for transforming the amorphous substance to the corresponding crystal having an unified orientation. Specifically, the single-crystal layer that is present in a junction area of the low-temperature deposited buffer layer joined to the surface of the sapphire substrate can also be effectively used for transforming an amorphous substance contained in the low-temperature-deposited buffer layer to the corresponding crystal having an unified orientation, so that an upper layer having an excellent well-unified orientation and single-crystal characteristics can be provided.

The single crystal or layered single crystal (single-crystal layer) present in a junction area which is in contact with the surface of the sapphire substrate has a thickness of at least about 1 nm.

In such a single crystal, constituent atoms (i.e., aluminum, gallium and nitrogen) are chemically bonded tightly with one another and adhere strongly to the sapphire substrate. Therefore, despite the layer thickness being about 1 nm, so long as the single crystal assumes the aforementioned layer form, the single crystal remains on the surface of the sapphire substrate even when the single crystal is placed under high-temperature conditions under which the GaN-based Group III nitride semiconductor layer has been formed on the low-temperature-deposited buffer layer, whereby exposure of the surface of the sapphire substrate is prevented. As a result, the GaN-based Group III nitride semiconductor layer having a well-unified orientation can be formed as an upper layer on such a single-crystal layer serving as an under layer.

The GaN-based Group III nitride semiconductor layer which is formed on the low-temperature-deposited buffer layer may be formed through a known vapor growth means, such as the halogen method, the hydride method or MOCVD, or through molecular beam epitaxy.

For example, on the low-temperature-deposited buffer layer of the present invention, the GaN-based Group III nitride semiconductor layers (a) to (g) shown below are sequentially stacked, whereby a GaN-based semiconductor stacked structure for fabricating a light-emitting diode (abbreviated as LED) can be formed. The Group III nitride semiconductor layers (a) to (g) may be grown through different means. However, all the layers including a low-temperature-deposited buffer layer are preferably grown through the same means (e.g., MOCVD) from the viewpoint of production of such a stacked structure.

(a) A silicon (Si)-doped n-type GaN layer (b) A superlattice structure composed of Si-doped n-type gallium indium nitrides ($Ga_{Y1}In_{Z1}N$: $0<Z1<1$, $Y1+Z1=1$) and $Ga_{Y2}In_{Z2}N$: $0<Z2<1$, $Z1\neq Z2$, $Y2+Z2=1$)

(c) A quantum well (QW) structure composed of an n-type GaN layer and an n-type layer of $Ga_{Y3}In_{Z3}N$ ($0<Z3<1$, $Z1<Z3$, $Z2<Z3$, $Y3+Z3=1$)

(d) A superlattice structure composed of a layer of $Al_{X1}Ga_{Y1}N$ ($0\leq X1$, $Y1\leq 1$, $X1+Y1=1$) and a layer of $Al_{X2}Ga_{Y2}N$ ($0\leq X2$, $Y2\leq 1$, $X1\neq X2$, $X2+Y2=1$)

(e) A p-type layer of $Al_{X3}Ga_{Y3}N$ ($0\leq X3$, $Y3\leq 1$, $X3<X1$ or $X2$, $X3+Y3=1$)

(f) A p-type layer of $Al_{X4}Ga_{Y4}N$ ($0\leq X4$, $Y4\leq 1$, $X4>X3$, $X4+Y4=1$)

(g) A p-type GaN layer

Instead of the aforementioned p-type Group III nitride semiconductor layer (e) or (g), or of the p-type layers (e) through (g), a p-type Group III-V semiconductor layer(s) may be stacked to form a stacked structure. In this case, a boron-phosphide-based semiconductor layer or a similar layer may serve as the p-type Group III-V semiconductor layer. Particularly, use of boron monophosphide (BP) having a lattice plane spacing equivalent to the a-axis (=0.319 nm) of GaN, is advantageous for producing a stacked structure having a p-type layer well matched with GaN.

The compound semiconductor device of the present invention is fabricated by appropriately working the aforementioned GaN-based semiconductor stacked structure and forming electrodes and other elements.

For example, the uppermost layer of the aforementioned stacked structure composed of the aforementioned p-type GaN layer (f) is employed as a contact layer, on which an ohmic electrode is formed. On the aforementioned n-type Group III nitride semiconductor layer (a) or (b), the ohmic electrode of the opposite polarity is provided. Through provision of these electrodes in such a manner, the n-type Group III nitride semiconductor layer (a) or (b) serves as an n-type cladding layer, the quantum well structure (c) serves as a light-emitting layer, and the p-type Group III nitride semiconductor layer (d) or (e) serves as a p-type cladding layer. A pn-junction double-hetero (DH) structure LED is fabricated from the layers.

In the present invention, the constituent layers included in the stacked structure are grown via a low-temperature-deposited buffer layer including a single-crystal layer having a well-unified orientation. Thus, each layer assumes the form of a single-crystal layer having a particularly unified orientation; i.e., having no crystal grain boundaries. In addition, the single-crystal layer included in the low-temperature-deposited buffer layer grown on the sapphire substrate has a surface crystal plane having characteristics identical with those of the surface of the sapphire substrate. Accordingly, a low-temperature-deposited buffer layer including a single-crystal layer having a (0001) crystal plane forming a surface is provided on a sapphire substrate having a (0001) plane forming the surface.

Since the crystal feature of the surface is reflected from the low-temperature-deposited buffer layer to an upper layer, the upper Group III nitride semiconductor layer comes to have a surface crystal having a well-unified crystal plane and orientation. The aforementioned LED fabricated from such a stacked structure exhibits excellent electrical properties. For example, unnecessary leak current caused by crystal grain boundaries, which are formed through, for example, combination of crystal grains having different orientations, can be reduced.

In the case in which a stacked structure for use in a light-emitting device, such as a light-emitting diode (LED) or a laser diode (LD), is formed, a thin-film layer composed of a GaN-based Group III nitride semiconductor containing indium (In) or aluminum (Al) or a superlattice structure layer including the thin-film layer may be interposed between a light-emitting layer and the low-temperature-deposited buffer layer of the present invention. The resultant light-emitting layer exhibits excellent crystallinity with few misfit dislocations by virtue of the thin-film layer.

For example, a stacked structure is fabricated by forming a light-emitting layer on a GaN layer provided on a low-temperature-deposited buffer layer via a thin-film layer composed of an aluminum gallium nitride mixed crystal ($Al_Q Ga_{1-Q}N$: $0<Q\leq 1$). Alternatively, a stacked structure is fabricated by interposing between an n-type light-emitting layer and a low-temperature-deposited buffer layer, a superlattice structure layer including a thin-film layer composed of an n-type gallium indium nitride mixed crystal ($Ga_Q In_{1-Q}N$: $0\leq Q\leq 1$). Through employment of such a stacked structure, a light-emitting layer which can emit high-intensity light can be produced.

Example 1

The present invention will next be described in detail by way of Example 1 that shows the case where a GaN-based Group III nitride semiconductor layer is grown on a sapphire substrate via a low-temperature-deposited buffer layer to thereby fabricate a stacked structure.

FIG. 1 is a schematic cross-sectional view of a stacked structure 10 as described in Example 1.

Group III nitride semiconductor layers 102 to 108 included in the stacked structure 10 were formed on the (0001) surface of a sapphire substrate 100 via a low-temperature-deposited buffer layer 101 composed of an aluminum gallium nitride mixed crystal ($Al_{0.10}Ga_{0.90}N$). The low-temperature-deposited buffer layer 101 was grown at 400° C. through an atmospheric pressure (near atmospheric pressure) MOCVD means by use of triethylgallium (($C_2H_5$)$_3$Ga) as a gallium (Ga) source, trimethylaluminum (($CH_3$)$_3$Al) as an aluminum (Al) source and ammonia ($NH_3$) as a nitrogen (N) source. The growth rate was adjusted to 3 nm/min by controlling the total concentration per unit time of ($C_2H_5$)$_3$Ga and ($CH_3$)$_3$Al supplied to the MOCVD reaction system. The thickness of the low-temperature-deposited buffer layer 101 was controlled to 18 nm.

The internal crystal structure of the low-temperature-deposited buffer layer 101 was analyzed in an as-grown state through electron diffraction method. The diffraction pattern assumed a spot-like pattern attributed to a region from the (0001) surface of the sapphire substrate 100 to a depth of about 8 nm, indicating that a single crystal was present inside the region of the low-temperature-deposited buffer layer 101 that was joined to the sapphire substrate 100. The electron diffraction pattern also indicated that the single-crystal layer was composed of a hexagonal crystal which was stacked on the (0001) surface of the sapphire substrate such that the (0001) plane of the hexagonal crystal and the (0001) surface of the sapphire substrate were unified in parallel to each other. On the basis of the relationship between diffraction and incident direction of electron beam, the [1.0.-1.0.] orientation of the single-crystal layer was found to be parallel to the [2.-1.-1.0.] direction of the sapphire substrate 100. It was noted that an amorphous substance having a height of about 10 nm was present discretely on the single-crystal layer.

On the $Al_{0.10}Ga_{0.90}N$ low-temperature-deposited buffer layer 101, the following GaN-based Group III nitride semiconductor layers 102 to 108 corresponding respectively to (1) through (7) were grown through MOCVD to thereby fabricate a stacked structure 10 of the present invention.

(1) An Si-doped n-type GaN layer 102 (carrier concentration (n)=$1 \times 10^{18}$ cm$^{-3}$, layer thickness (t)=5,500 nm)

(2) A superlattice structure layer 103 formed from twelve Si-doped n-type layers of gallium indium nitride mixed crystal ($Ga_{0.98}In_{0.02}N$, t=1.5 nm) and eleven Si-doped n-type layers of gallium indium nitride mixed crystal ($Ga_{0.99}In_{0.01}N$, t=1.5 nm)

(3) A quantum well structure layer 104 formed from eight n-type layers of GaN (t=15 nm) and seven n-type layers of $Ga_{0.95}In_{0.05}N$ (t=2.0 nm)

(4) A high-resistive layer 105 composed of $Al_{0.25}Ga_{0.75}N$ (t=1.5 nm)

(5) A superlattice structure layer 106 formed from three layers of $Al_{0.10}Ga_{0.90}N$ mixed crystal (t=1.5 nm) and four layers of $Al_{0.10}Ga_{0.88}In_{0.02}N$ mixed crystal (t=1.5 nm)

(6) A p-type layer 107 of $Al_{0.10}Ga_{0.90}N$ (carrier concentration (p)=$6 \times 10^{17}$ cm$^{-3}$, t=2.0 nm)

(7) A p-type layer 108 of $Al_{0.05}Ga_{0.95}N$ layer (carrier concentration (p)=$9 \times 10^{17}$ cm$^{-3}$, t=350 nm)

Since the aforementioned Group III nitride semiconductor layers (1) to (7) were grown via the low-temperature-deposited buffer layer 101 including a single-crystal layer, all the grown layers assumed the form of single-crystal layers. Through observation based on cross-sectional TEM, no amorphous substance was observed in the junction interface between the low-temperature-deposited buffer layer 101 and the n-type GaN layer 102 grown at a higher temperature of 1,080° C., indicating that the n-type GaN layer 102 was considered to be grown so as to be directly joined to the single-crystal layer present in the low-temperature-deposited buffer layer 101 in an as-grown state. Therefore, the amorphous substances scattered on the single-crystal layer present in the low-temperature-deposited buffer layer in an as-grown state may be sublimated during deposition of the n-type GaN layer 102 at a high temperature (1,080° C.).

In addition, since the Group III nitride semiconductor layers 102 to 108 were deposited on the low-temperature-deposited buffer layer 101 including a single-crystal layer having a well-unified orientation, all these layers assumed hexagonal single-crystal layers each having a [1.0.-1.0.] orientation parallel to the [2.-1.-1.0.] direction of the sapphire substrate 100. Thus, there was provided a stacked structure 10 including GaN-based Group III nitride semiconductor single-crystal layers 102 to 108 each having a well-unified orientation and excellent single-crystal characteristics.

Example 2

The present invention will next be described in detail by way of Example 2 showing the case where an LED is fabricated from the stacked structure of the present invention.

Figure 2:
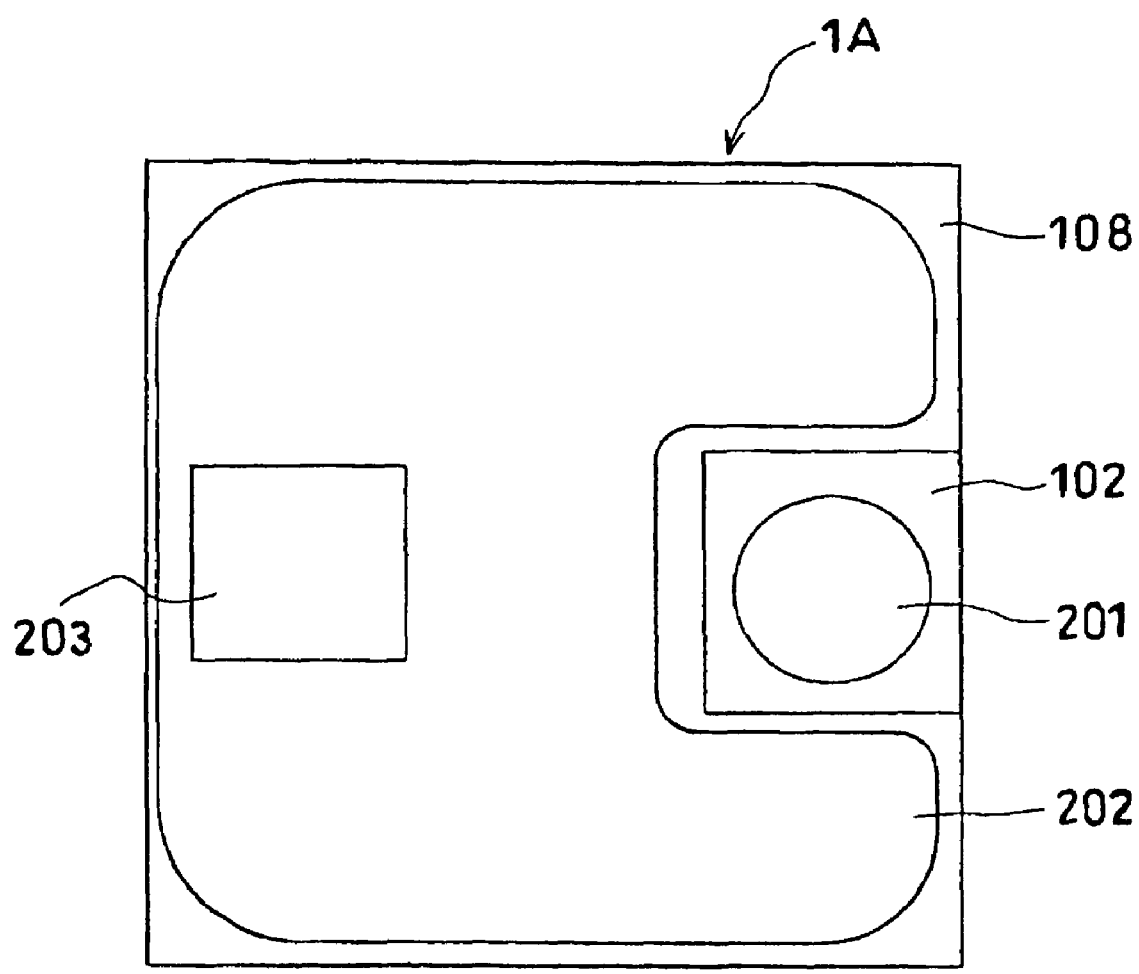
FIG. 2 is a schematic plan view of the light-emitting diode (LED) of Example 2 of the present invention.
Figure 3:
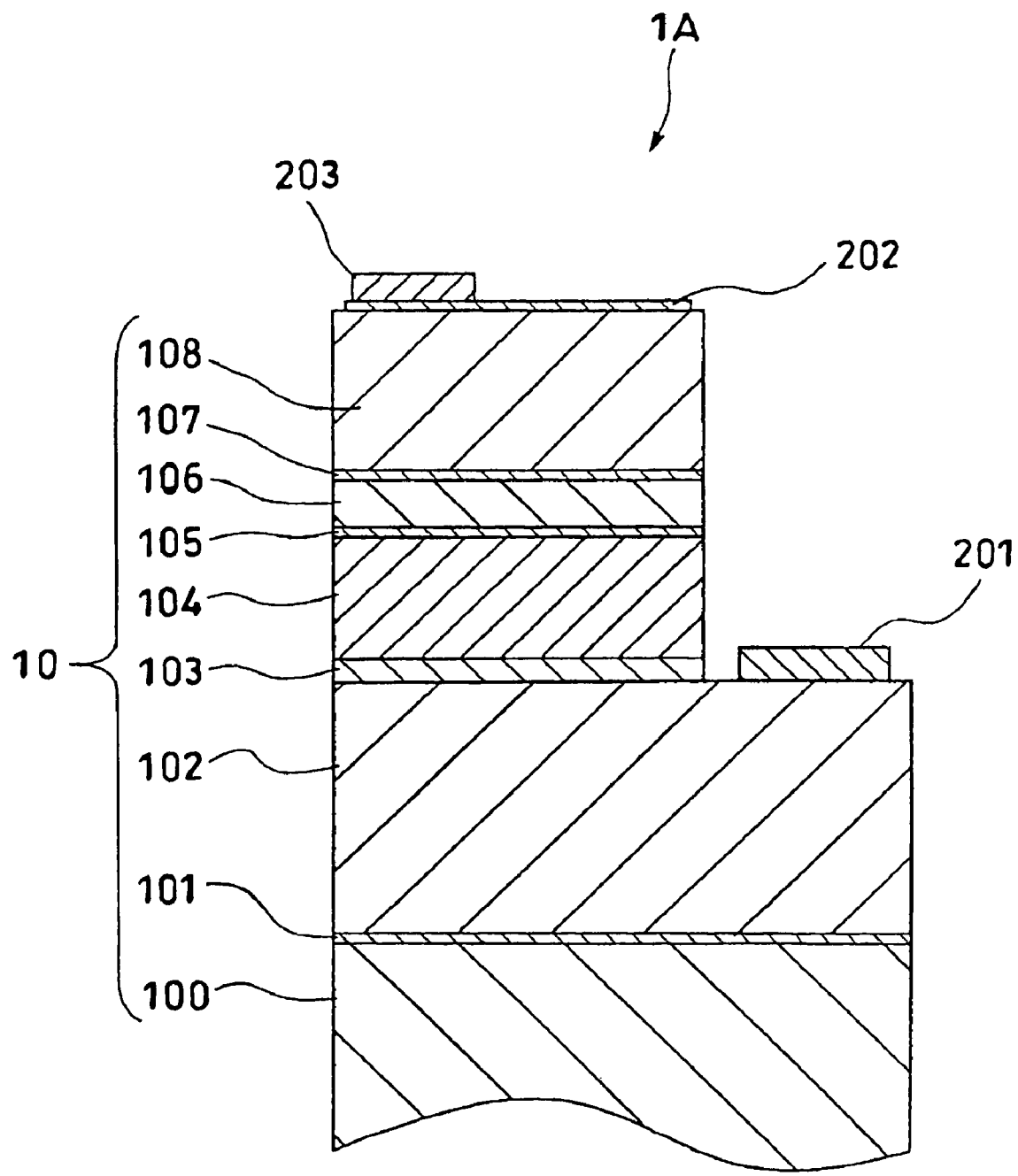
FIG. 3 is a schematic cross-section of the LED of Example 2 of the present invention.

FIG. 2 is a schematic plan view of a light-emitting diode (LED) 1A of Example 2 fabricated from the stacked structure 10 produced in Example 1. FIG. 3 is a schematic cross-sectional view of the light-emitting diode (LED) 1A. In FIGS. 2 and 3, the same constituent elements as shown in FIG. 1 are denoted by the same reference numerals.

The stacked structure 10 of Example 1 was processed through a conventional plasma etching means, whereby a portion of the surface of the n-type GaN layer 102 provided via the low-temperature-deposited buffer layer 101 was exposed, the portion being exclusively used for an area where an n-type ohmic electrode 201 is to be provided.

Subsequently, on the surface of the thus exposed portion of the n-type GaN layer 102, tungsten (W) and aluminum (Al) films were sequentially stacked, thereby providing the n-type ohmic electrode 201.

On the surface of the p-type $Al_{0.05}Ga_{0.95}N$ layer 108 serving as the surface of the stacked structure 10, gold (Au)-gallium (Ga)-nickel (Ni) alloy film and nickel oxide film were sequentially deposited and placed in the form of lattice-like pattern, thereby forming a p-type ohmic electrode 202. On a corner of the p-type ohmic electrode 202, a pad electrode 203 having an upper layer formed of gold (Au)-titanium (Ti) alloy film and a nickel (Ni) bottom layer was provided so as to attain electrical connection with the p-type ohmic electrode 202.

Through the above procedure, there was fabricated a light-emitting diode (LED) 1A having a pn-junction double-hetero (DH) structure, which structure was composed of the n-type GaN layer 102 of Example 1 serving as an n-type cladding layer, the quantum well structure layer 104 (GaN layers/n-type $Ga_{0.95}In_{0.05}N$ layers) serving as a light-emitting layer and the uppermost p-type $Al_{0.05}Ga_{0.95}N$ layer 108 serving as a p-type contact layer.

Emission characteristics of the light-emitting diode (LED) 1A were evaluated when forward device operation current (20 mA) was caused to flow between the n-type ohmic electrode 201 and the p-type ohmic electrode 202. The light-emitting diode (LED) 1A was found to emit blue light having a center wavelength of 450 nm. The emission intensity of the LED chip before resin-molding, as determined through a typical integrating sphere, was as high as about 5 mW. The forward voltage (Vf) was found to be as low as 3.3 V.

Since the n-type ohmic electrode 201 and the p-type ohmic electrode 202 were formed on a Group III nitride semiconductor layer having excellent crystallinity via the low-temperature-deposited buffer layer 101 including a single-crystal layer having a well-unified orientation in an as-grown state, the LED exhibited few local breakdowns. Thus, the reverse voltage at a reverse current of 10 µA was found to be higher than 15 V.

Example 3

The present invention will next be described in detail by way of Example 3 showing the case where an LED is fabricated from the stacked structure of the present invention.

The procedure of Example 1 was repeated, except that a low-temperature-deposited buffer layer 101a was fabricated from gallium nitride (GaN) different from that employed in Example 1, to thereby fabricate a stacked structure.

Figure 4:
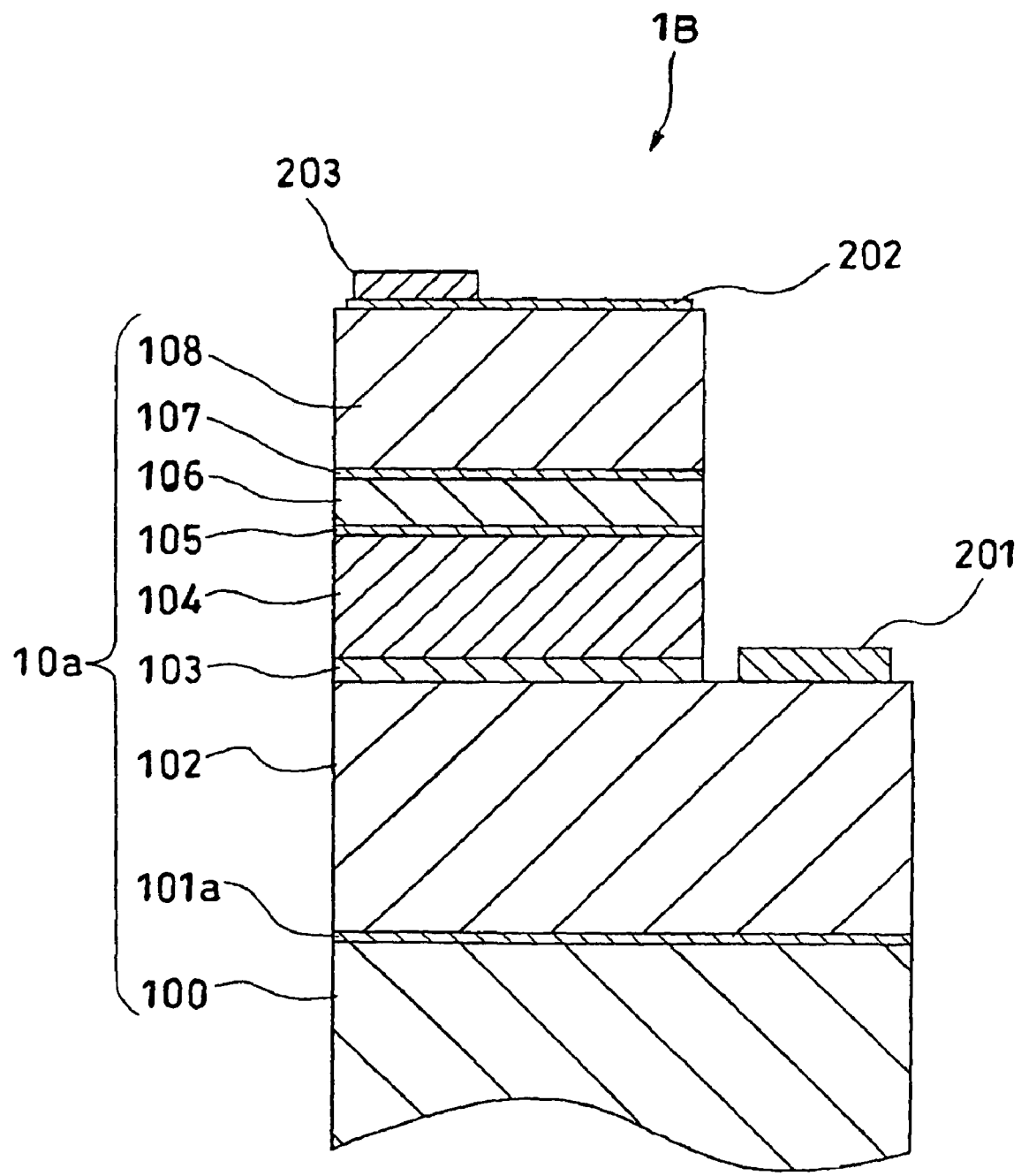
FIG. 4 is a schematic cross-section of the LED of Example 3 of the present invention.

FIG. 4 is a schematic cross-sectional view of a light-emitting diode (LED) 1B.

The GaN low-temperature-deposited buffer layer 101a was formed at 350° C. through an atmospheric pressure (near atmospheric pressure) MOCVD means by use of $(CH_3)_3Ga$ and NH₃ as sources. The total thickness of the GaN layer serving as the low-temperature-deposited buffer layer 101a was controlled to 15 nm.

The structural analysis on the basis of a conventional electron diffraction technique revealed that the junction portion of the low-temperature-deposited buffer layer 101a joined to the sapphire substrate 100 was formed, in an as-grown state, of a single-crystal layer composed of a hexagonal GaN having an a-axis unified in parallel to the [0.1.–1.0.] direction of the sapphire substrate. The single-crystal layer was found to cover virtually the entire surface of the (0001) plane of the sapphire substrate. The electron diffraction patterns indicated that the aforementioned alignment feature was maintained over the area of the substrate. On the (0001) surface of the GaN single-crystal layer, an amorphous substance having a generally circular cross-section was present discretely. Since no such amorphous substance was observed on the surface of the GaN low-temperature-deposited buffer layer 101a after formation of the constituent layers of the stacked structure, the amorphous substance may be sublimated during formation of the constituent layers at high temperature.

In a manner similar to that described in relation to Example 2, the stacked structure 10a was etched, and an n-type ohmic electrode 201 and a p-type ohmic electrode 202 having the same structure were provided in the same positions. Similarly to Example 2, the thus fabricated light-emitting diode (LED) 1B was found to emit blue light having a center wavelength of 450 nm at a forward current of 20 mA. The emission intensity of the LED chip before resin-molding, as determined through a typical integrating sphere, was as high as about 5 mW. The forward voltage (Vf) was found to be as low as 3.3 V. Since the n-type ohmic electrode 201 and the p-type ohmic electrode 202 were formed on a GaN-based single-crystal layer having a well-unified orientation and excellent crystallinity via the low-temperature-deposited buffer layer 101a having the crystal feature according to the present invention, the provided LED exhibited few local breakdowns.

INDUSTRIAL APPLICABILITY

As has been described in the foregoing, according to the present invention, the low-temperature-deposited buffer layer composed of a single-crystal containing gallium in an amount more than that of aluminum is formed at a specific growth temperature and growth rate. Therefore, a single-crystal layer that is well-unified with a specific crystal orientation of the sapphire substrate can be formed. In addition, the single-crystal layer advantageously enhances the orientation of a GaN-based semiconductor single-crystal layer formed on the buffer layer. Through employment of the stacked structure having a well-unified orientation and excellent single-crystal characteristics, semiconductor devices, such as a light-emitting diode, exhibiting excellent discharge characteristics, i.e. causing few local breakdowns in the reverse direction, can be effectively produced.

The invention claimed is:

1. A method for forming a gallium-nitride-based semiconductor stacked structure comprising the steps of:
   providing a sapphire substrate;
   forming, on the sapphire substrate, a low-temperature-deposited buffer layer which is composed of a Group III nitride material of $Al_XGa_YN$ ($0.5<Y\leq1$, $X+Y=1$) containing gallium (Ga) in a predominant amount with respect to aluminum (Al) and which is provided in a junction area thereof joined to a (0001) plane (c-plane) of the sapphire substrate with a single crystal in an as-grown state; and
   forming a gallium-nitride-based semiconductor layer on the low-temperature-deposited buffer layer;
   wherein the low-temperature-deposited buffer layer is formed on the (0001) plane of the sapphire substrate in such a manner that the junction area is predominantly formed of an as-grown single crystal which has a [1.0.–1.0.] orientation parallel to a [2.–1.–1.0.] direction of a lattice forming the (0001) plane of the sapphire substrate,
   wherein the as-grown single crystal which is contained in the low-temperature-deposited buffer layer and which predominantly forms the junction area joined to the sapphire substrate has a thickness of 1 nm or more when formation of the low-temperature-deposited buffer layer has been completed.

2. A method for forming a gallium-nitride-based semiconductor stacked structure according to claim 1, wherein the low-temperature-deposited buffer layer is formed on the (0001) plane of the sapphire substrate at 350° C. to 450° C.

3. A method for forming a gallium-nitride-based semiconductor stacked structure according to claim 1, wherein the low-temperature-deposited buffer layer is formed on the (0001) plane of the sapphire substrate at a growth rate of 1 nm/min to 3 nm/min.

4. A method for forming a gallium-nitride-based semiconductor stacked structure comprising the steps of:
   providing a sapphire substrate;
   forming, on the sapphire substrate, a low-temperature-deposited buffer layer which is composed of a Group III nitride material of $Al_XGa_YN$ ($0.5<Y\leq1$, $X+Y=1$) containing gallium (Ga) in a predominant amount with respect to aluminum (Al) and which is provided in a junction area thereof joined to a (0001) plane (c-plane) of the sapphire substrate with a single crystal in an as-grown state; and
   forming a gallium-nitride-based semiconductor layer on the low-temperature-deposited buffer layer;
   wherein the low-temperature-deposited buffer layer is formed on the (0001) plane of the sapphire substrate in such a manner that the junction area is predominantly formed of an as-grown single crystal which has a [1.0.–1.0.] orientation parallel to a [2.–1.–1.0.] direction of a lattice forming the (0001) plane of the sapphire substrate, and
   wherein the low-temperature-deposited buffer layer is formed on the (0001) plane of the sapphire substrate at a growth rate of 1 nm/min to 3 nm/min controlled through regulation of an amount, per unit time, of a Group III element source including gallium or aluminum supplied to a growth reaction system for growing the low-temperature-deposited buffer layer.

* * * * *